(12) United States Patent
Narasimhan et al.

(10) Patent No.: US 7,492,598 B2
(45) Date of Patent: Feb. 17, 2009

(54) HEATSINK ATTACHMENT MECHANISM

(75) Inventors: Susheela Narasimhan, Milpitas, CA (US); Nguyen T. Nguyen, San Jose, CA (US); Saeed Sayed, Los Altos Hills, CA (US); Mohammad Reza Danesh Kadivar, Santa Clara, CA (US)

(73) Assignee: Cisco Technology, Inc., San Jose, CA (US)

( * ) Notice: Subject to any disclaimer, the term of this patent is extended or adjusted under 35 U.S.C. 154(b) by 7 days.

(21) Appl. No.: 11/533,514

(22) Filed: Sep. 20, 2006

(65) Prior Publication Data

US 2008/0068809 A1    Mar. 20, 2008

(51) Int. Cl.
*H05K 7/20* (2006.01)
*F28F 7/00* (2006.01)
*H01L 23/34* (2006.01)

(52) U.S. Cl. .............. 361/719; 165/80.2; 165/185; 257/719; 361/704

(58) Field of Classification Search .......... 361/719–721
See application file for complete search history.

(56) References Cited

U.S. PATENT DOCUMENTS

| | | | |
|---|---|---|---|
| 5,307,236 A * | 4/1994 | Rio et al. ............... | 361/720 |
| 5,329,426 A | 7/1994 | Villani | |
| 5,640,305 A | 6/1997 | Smithers | |
| 5,786,989 A | 7/1998 | Kawabe | |
| 6,180,874 B1 * | 1/2001 | Brezina et al. ............ | 174/16.3 |
| 6,212,074 B1 | 4/2001 | Gonsalves et al. | |
| 6,239,972 B1 * | 5/2001 | Tehan et al. ................. | 361/704 |
| 6,313,995 B1 * | 11/2001 | Koide et al. ................ | 361/705 |
| 6,483,704 B2 * | 11/2002 | Ulen et al. .................. | 361/704 |
| 6,687,129 B1 * | 2/2004 | Wilson et al. .............. | 361/730 |
| 6,856,511 B1 | 2/2005 | Viernes et al. | |
| 6,980,437 B2 * | 12/2005 | Bright ........................ | 361/704 |
| 7,113,406 B1 * | 9/2006 | Nguyen et al. .............. | 361/719 |
| 7,120,027 B2 * | 10/2006 | Yatskov et al. .............. | 361/716 |
| 7,170,165 B2 * | 1/2007 | Berto et al. ................. | 257/718 |
| 7,206,206 B2 * | 4/2007 | Lin et al. .................... | 361/719 |
| 7,321,493 B2 | 1/2008 | Liang et al. | |
| 7,324,344 B2 | 1/2008 | Sya et al. | |
| 2004/0105236 A1 * | 6/2004 | Lee et al. .................... | 361/704 |
| 2005/0146343 A1 * | 7/2005 | Wright et al. ............... | 324/760 |
| 2005/0254217 A1 | 11/2005 | Lo et al. | |

* cited by examiner

*Primary Examiner*—Gregory D Thompson
(74) *Attorney, Agent, or Firm*—Peggy A. Su

(57) ABSTRACT

Methods and apparatus for supporting heatsinks used to cool components of a board are disclosed. According to one aspect of the present invention, a carrier plate assembly that is arranged to be secured over a structure which has a first structure hole and a first component includes a carrier plate and a first heatsink. The carrier plate has a first plate mounting hole and a first opening defined therein. The first plate mounting hole is arranged to be aligned with the first structure hole such that a first axis is defined through the first plate mounting hole and the first structure hole. The first opening is arranged to be positioned over the first component. The first heatsink is positioned such that a first portion of the first heatsink protrudes through the opening and a second portion of the first heatsink is supported on the carrier plate.

14 Claims, 6 Drawing Sheets

HEATSINK ATTACHMENT MECHANISM

BACKGROUND OF THE INVENTION

1. Field of Invention

The present invention relates generally to dissipating heat generated by components of a printed circuit board. More particularly, the present invention relates to a heatsink attachment mechanism that supports heatsinks and utilizes existing mounting holes on a printed circuit board for attachment purposes.

2. Description of the Related Art

The power dissipation of electrical components, e.g., application specific integrated circuits (ASICs) and processors, is increasing while the amount of available space on printed circuit boards for cooling devices is decreasing. As such, the space available to accommodate heatsinks and heat spreaders is often insufficient to meet the cooling needs associated with various components. Further, mechanical fasteners are often needed to secure heatsinks and heat spreaders to printed circuit boards which have relatively high power dissipating components, as the thermal impedance associated with pressure sensitive adhesives is often insufficient.

Routing constraints, layout constraints, and signal integrity requirements for printed circuit boards that include many components with relatively high power dissipation are often such that it is difficult or even impossible to include mounting holes or mechanical fastening holes that may be used to secure heatsinks or heat spreaders over the components.

Therefore, what is needed is a method and an apparatus which allows heatsinks to be incorporated into assemblies in which there are few dedicated mounting holes for the heatsinks. That is, what is desired is a method and an apparatus which allows heatsinks to be mounted using holes of a printed circuit board that are typically intended for other purposes.

BRIEF DESCRIPTION OF THE DRAWINGS

The invention may best be understood by reference to the following description taken in conjunction with the accompanying drawings in which.

DESCRIPTION OF THE EXAMPLE EMBODIMENTS

Space on printed circuit boards that is unpopulated and devoid of traces and unpopulated is a commodity. Typically, circuit boards contain an increasingly high density of traces, and an increasing number of components such as application specific integrated circuits (ASICs), capacitors, resistors, power supply circuitry, and memory banks. As such, there is generally little space available on a circuit board to accommodate mechanical fasteners, e.g., screws, that secure cooling devices such as heatsinks and heat spreaders.

A circuit board, e.g., a motherboard, is typically mounted to a carrier tray within an overall chassis or electronics enclosure. In general, a circuit board includes a set of mounting holes that enable the circuit board to be mounted or otherwise secured to a carrier tray, which is often fabricated from stainless steel. When a motherboard has an associated daughter board or card, the daughter board may be mounted over the motherboard such that mounting holes on the daughter board are coincident with the mounting holes on the motherboard. Hence, the daughter board may be secured to the motherboard and the carrier tray via fasteners and standoffs, e.g., spacers, that fasten daughter board, motherboard, and carrier tray together through the mounting holes.

A heatsink carrier plate or tray that is positioned substantially over a circuit board may utilize the mounting holes of the board that are used to mount the board on another board or a carrier tray. The use of standoffs enables the heatsink carrier plate to effectively be suspended at a distance above the board while secured using the mounting holes of the board. The heatsink carrier plate may include openings to accommodate heatsinks, as well as openings which may be used to secure the heatsinks to the heatsink carrier plate. As the heatsinks are mounted to the carrier plate and not to the board, the inclusion of mounting holes on the board to which the heatsinks may be secured is not necessary. Hence, heatsinks may effectively be positioned in desired positions over components on a board, without the need for mounting holes on the board.

Figure 1A:
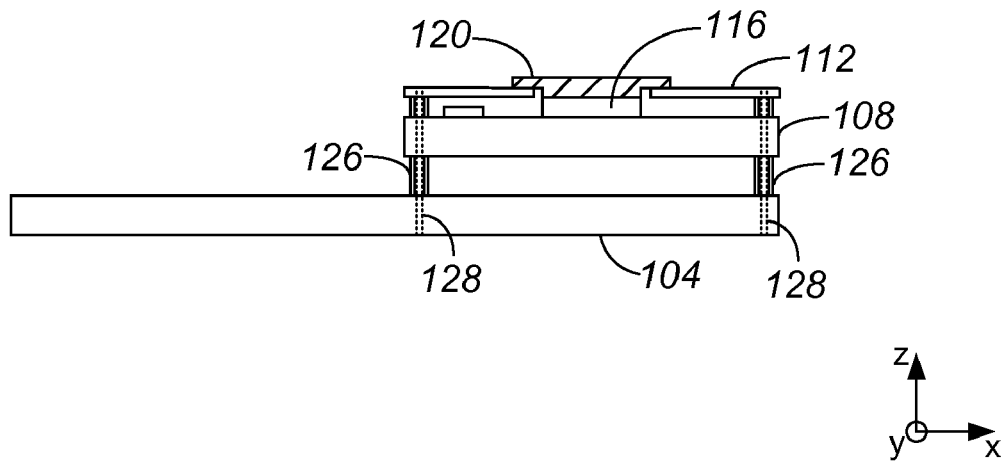
FIG. 1A is a diagrammatic side-view cross-sectional representation of an assembly that includes a heatsink carrier plate in accordance with an embodiment of the present invention.
Figure 1B:
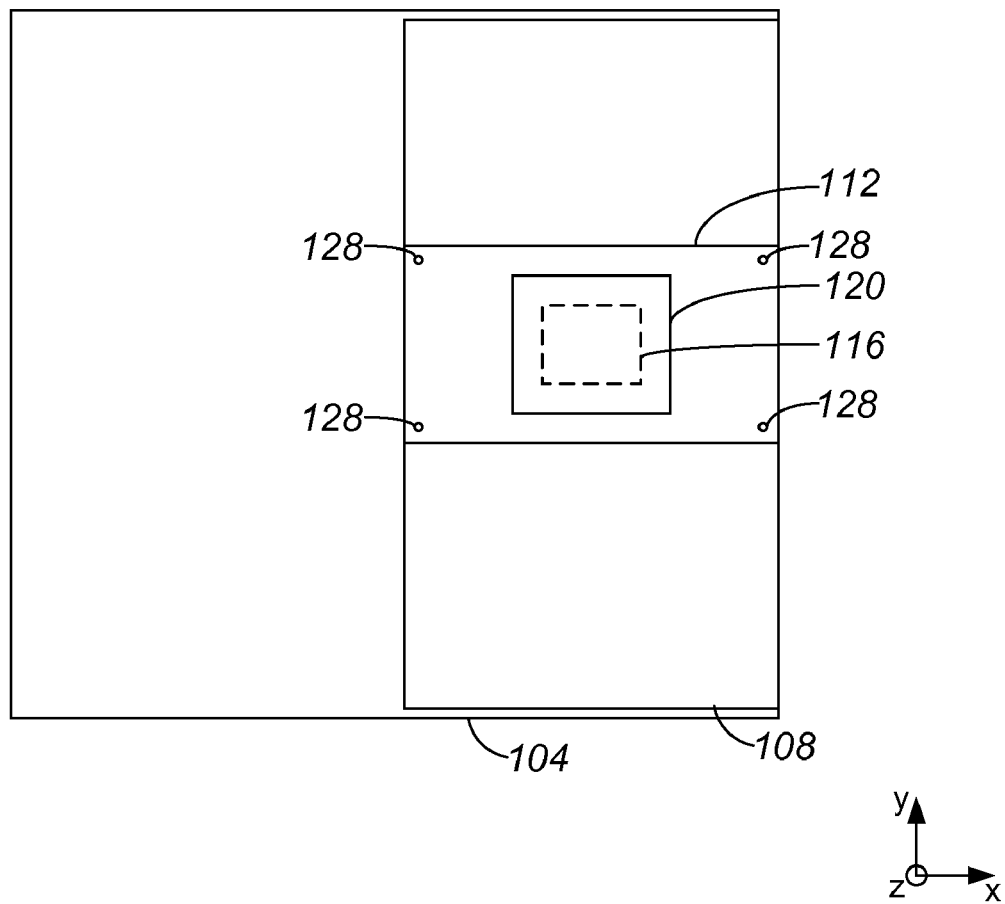
FIG. 1B is a diagrammatic top-view representation of an assembly that includes a heatsink carrier plate, i.e., assembly 100 with heatsink carrier plate 112 of FIG. 1A, in accordance with an embodiment of the present invention.

A heatsink carrier plate is arranged to be a part of an overall board assembly. FIG. 1A is a diagrammatic side-view cross-sectional representation of an assembly that includes a heatsink carrier plate in accordance with an embodiment of the present invention, and FIG. 1B is a diagrammatic top-view representation of the assembly in accordance with an embodiment of the present invention. A board assembly 100 includes at least one circuit board 108. Board 108 contains a component 116 that generates heat and, hence, may benefit from contact with a cooling device such as a heatsink 120. Board 108 is mechanically coupled to a structure 104 using a standoff arrangement that includes a standoff 126 and a fastener arrangement 128 that secures board 108 to structure 104 and maintains a distance between board 108 and structure 104. In one embodiment, board 108 is a daughter board and structure 104 is a motherboard. Alternatively structure 104 may be a carrier plate that facilitates the mounting of board 108 within an enclosure (not shown). It should be appreciated that if structure 104 is a motherboard, structure 104 may be mounted to a carrier plate (not shown) using fastener arrangement 128.

A carrier plate 112 is arranged to support a cooling device 120 such that cooling device 120 comes into contact with component 116. Carrier plate 112 is mounted to board 108 and, further, to structure 104 using fastener arrangement 128. Mounting holes (not shown) through which fastener arrangement 128 passes in carrier plate 112, board 108, and structure 104 are coincident in that a mounting hole in carrier plate 112 is substantially aligned with mounting holes in board 108 and structure 104.

Figure 2A:
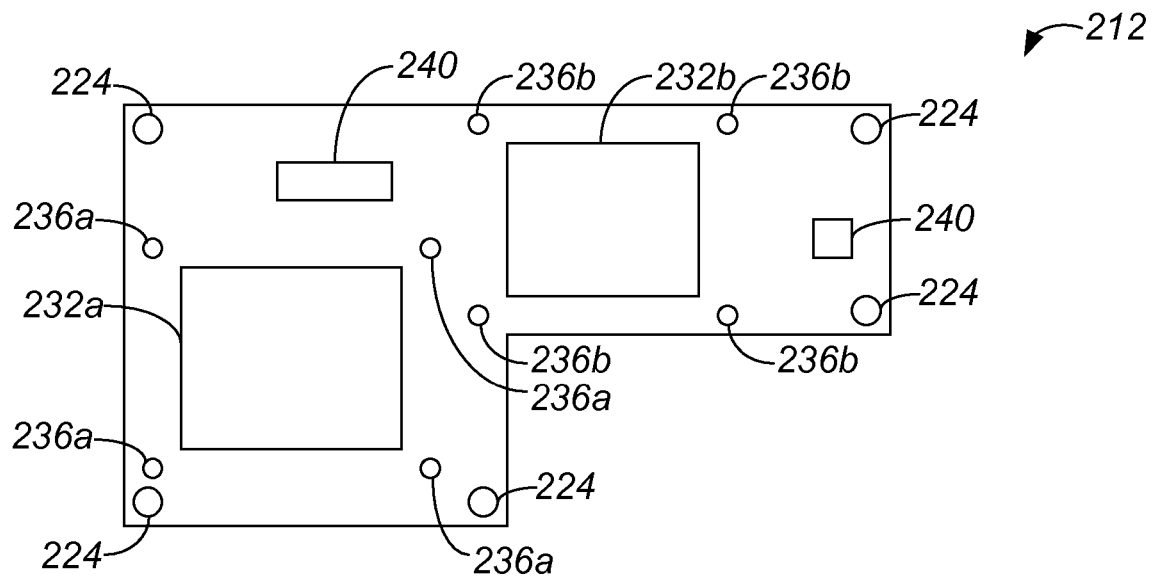
FIG. 2A is a diagrammatic top-view representation of a heatsink carrier plate in accordance with an embodiment of the present invention.

A heatsink carrier plate may include a number of openings. The openings include, but are not limited to, openings that enable portions of heatsinks to protrude therethrough, openings that allow relatively tall components of an underlying board to extend therethrough, openings that allows heatsinks to be secured to the heatsink carrier plate, and openings that allow fasteners to be inserted therethrough to secure the heatsink carrier plate to an underlying board. With reference to FIG. 2A, a heatsink carrier plate will be described in accordance with an embodiment of the present invention. A heatsink carrier plate 212 includes openings 232a, 232b that are arranged to enable portions of heatsinks (not shown) mounted on heatsink carrier plate 212 to protrude therethrough. Mounting holes 236a may be used to secure a heatsink (not shown) associated with opening 232a to heatsink carrier plate 212, and mounting holes 236b may be used to secure a heatsink (not shown) associated with opening 232b to heatsink carrier plate 212. Mounting holes 236a, 236b may be threaded such that screws may be accommodated therein.

Openings 232a, 232b are arranged to be located over components of an underlying board (not shown) that are to be cooled. Openings 240 are arranged to be located over components of an underlying board (not shown) that may be relatively tall such that the components may extend past a bottom of carrier plate 212. That is, openings 240 may enable heatsink carrier plate 212 to accommodate relatively high profile components. In general, openings 240 may be positioned over components of an underlying board (not shown) over which clearance is necessary or beneficial.

Mounting holes 224 are defined in heatsink carrier plate 212 in positions that coincide with existing mounting holes of a board or structure (not shown) over which heatsink carrier plate 212 is to be mounted. The existing mounting holes of the board or structure (not shown) are generally mounting holes intended to mount the board or structure to another structure, and are not dedicated to the mounting of heatsink carrier plate 212.

Figure 2B:
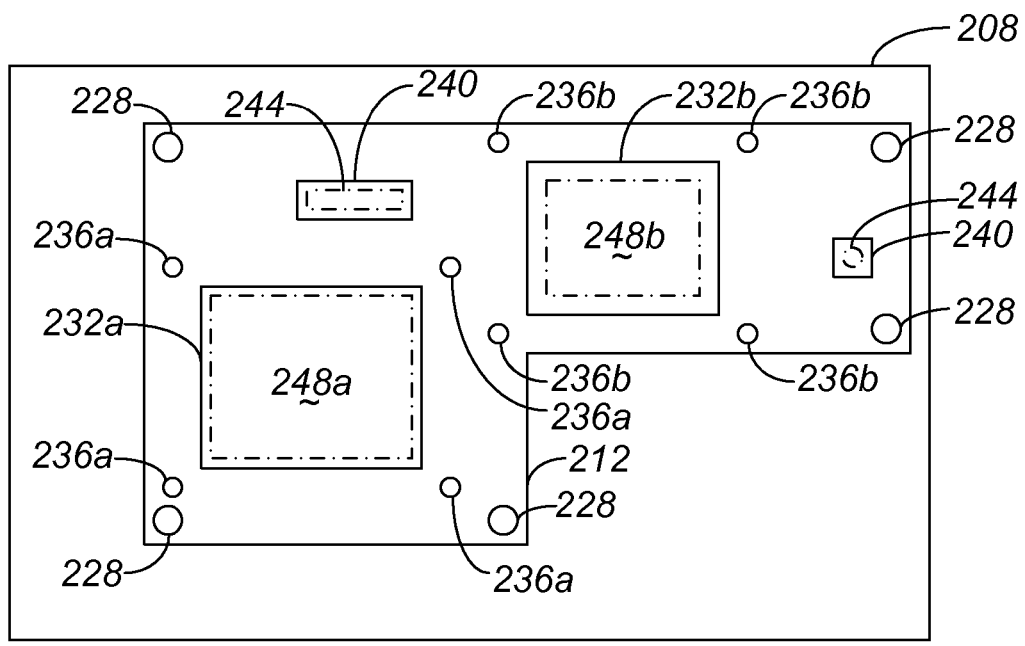
FIG. 2B is a diagrammatic representation of a heatsink carrier plate, i.e., heatsink carrier plate 212 of FIG. 2A, overlaid on a circuit board in accordance with an embodiment of the present invention.

FIG. 2B is a diagrammatic representation of a heatsink carrier plate 212 overlaid on a board with components in accordance with an embodiment of the present invention. When heatsink carrier plate 212 is positioned over a board 208, fastener arrangements 228 are used to secure heatsink carrier plate 212 to board 208. Fastener arrangements 228 include, in one embodiment, standoffs and mechanical fasteners. Fastener arrangements 228 utilize mounting holes 224, as shown in FIG. 2A, and existing mounting holes (not shown) in board 208.

Board 208 includes components 248a, 248b that are to be cooled using heatsinks. Hence, component 248a is positioned below opening 232a, and component 248b is positioned below opening 232b. Board 208 also includes components 244 that are positioned below openings 240. Typically, openings 232a, 232b, 240 are formed in heatsink carrier plate 212 based upon the location of components 248a, 248b, 244 of board 208.

Figure 2C:
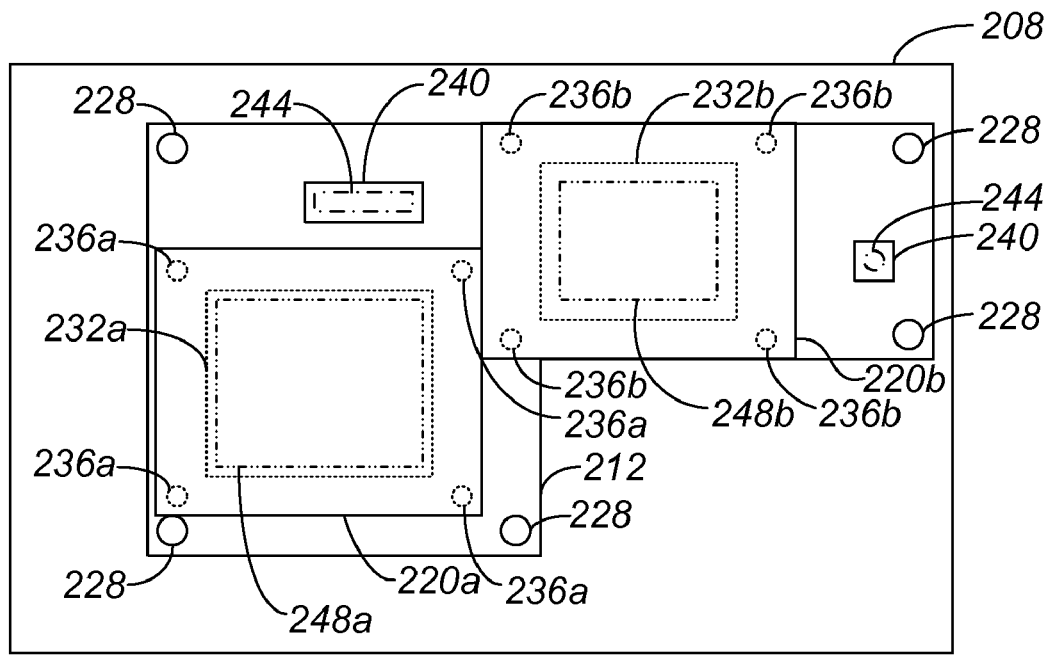
FIG. 2C is a diagrammatic representation of a heatsink carrier plate i.e., heatsink carrier plate 212 of FIG. 2A, on which heatsinks are positioned in accordance with an embodiment of the present invention.
Figure 2D:
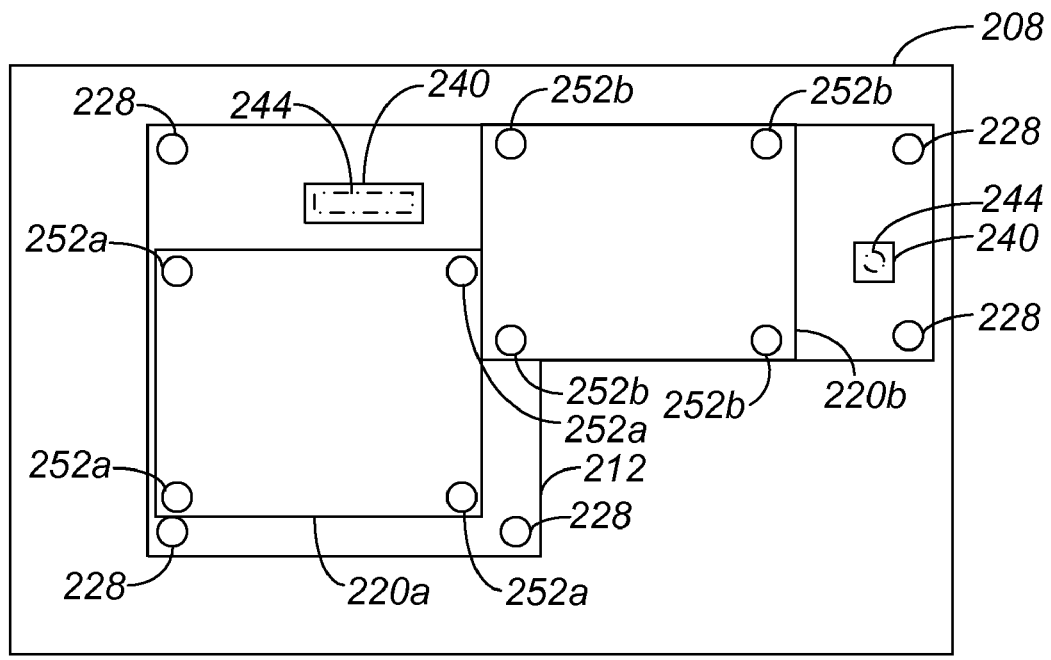
FIG. 2D is a diagrammatic representation of a heatsink carrier plate i.e., heatsink carrier plate 212 of FIG. 2A, on which heatsinks, i.e., heatsinks 220a and 220b of FIG. 2C, are screwed into place in accordance with an embodiment of the present invention.

Referring next to FIG. 2C, the placement of heatsinks on heatsink carrier plate 212 over openings 232a, 232b will be described in accordance with an embodiment of the present invention. A heatsink 220a is positioned over component 248a such that part of heatsink 220a extends through opening 232a and contacts component 248a. Edges of heatsink 220a overlap mounting holes 236a such that heatsink 220a may be secured to heatsink carrier plate 212. Similarly, a heatsink 220b is positioned on heatsink carrier plate 212 such that heatsink 220b overlaps mounting holes 236a and also contacts component 248b. As shown in FIG. 2D, which is a top-view representation of an assembly which includes heatsinks 220a, 220b as well as heatsink carrier plate 212 and board 208, heatsink 220a may be attached to heatsink carrier plate 212 using screw arrangements 252a, while heatsink 220b may be attached to heatsink carrier plate 212 using screw arrangements 252b. In one embodiment, screw arrangements 252a, 252b may include shoulder or set screws and o-rings.

Figure 3A:
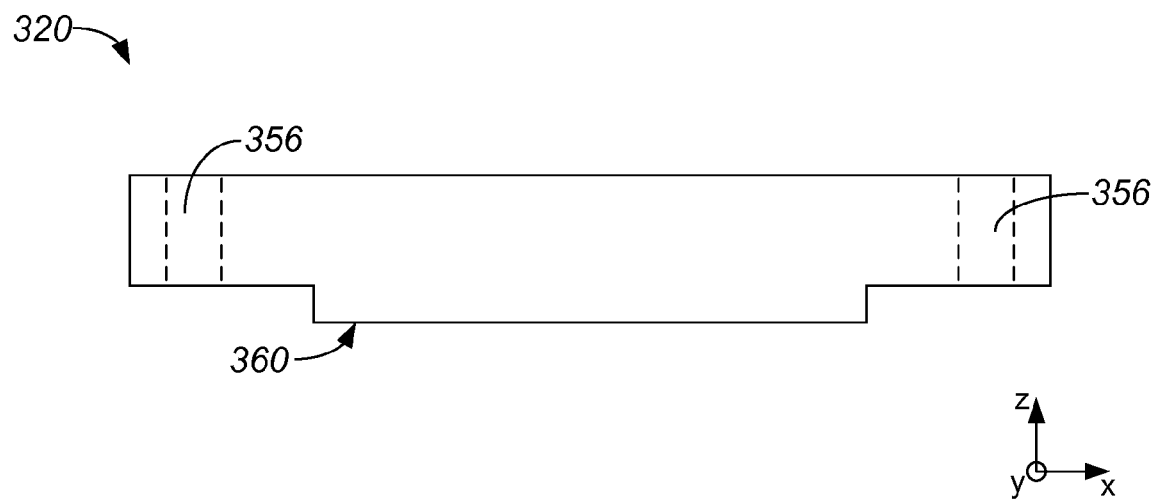
FIG. 3A is a diagrammatic side-view representation of a heatsink in accordance with an embodiment of the present invention.
Figure 3B:
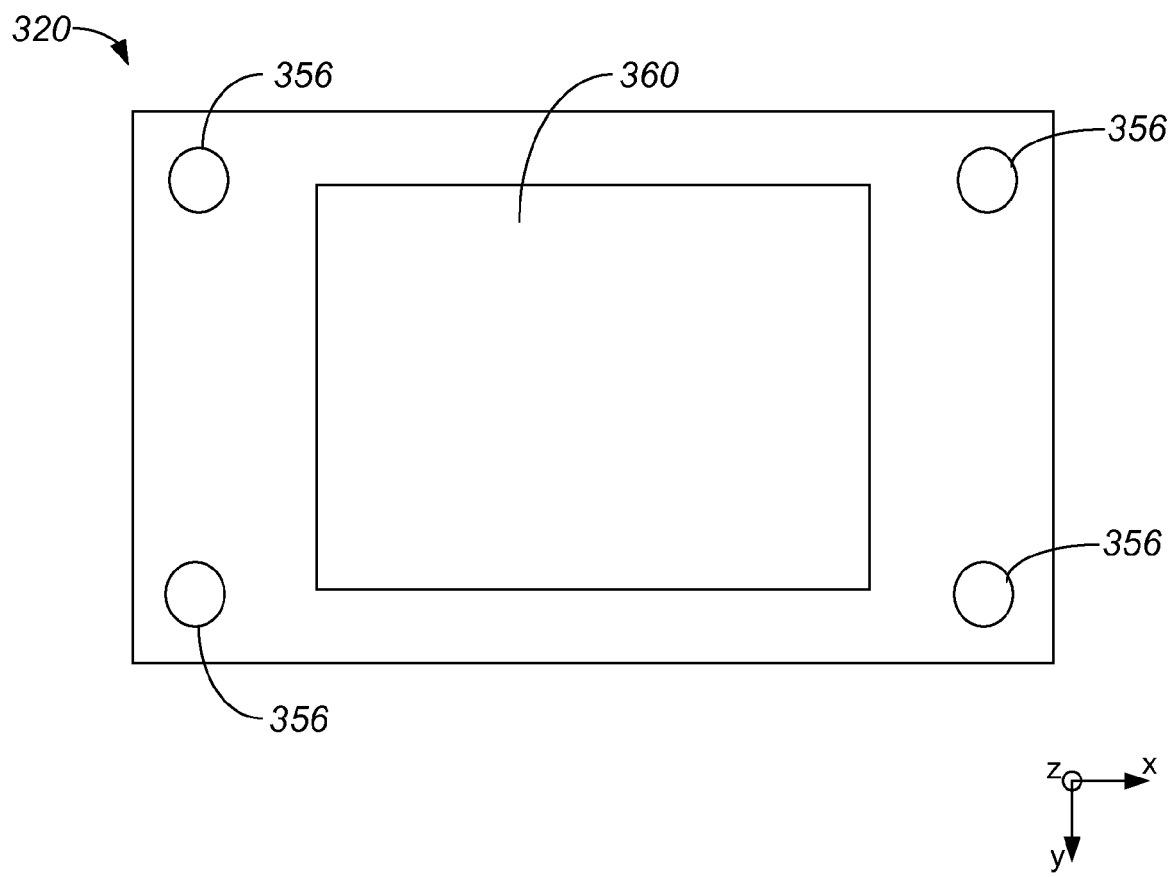
FIG. 3B is a diagrammatic bottom-view representation of a heatsink, i.e., heatsink 320 of FIG. 3A, in accordance with an embodiment of the present invention.

As mentioned above, heatsinks are arranged to be secured to a heatsink carrier plate while portions of the heatsinks extend through openings in the heatsink carrier plate. FIG. 3A is a diagrammatic side-view representation of a heatsink in accordance with an embodiment of the present invention, and FIG. 3B is a diagrammatic bottom-view representation of the heatsink in accordance with an embodiment of the present invention. A heatsink 320 includes a contact surface 360 that is arranged to be in contact with a component to be cooled. In one embodiment, contact surface 360 may be is substantially direct contact with a component to be cooled. However, contact surface 360 may instead be interfaces or in contact with a component to be cooled through a thermal interface material such as a phase change pad or a relatively high conductivity gap pad. That is, contact surface 360 may be indirectly in contact with a component to be cooled through a pad. Such a pad (not shown) may be considered to be a part of heatsink 320.

Openings 356 in heatsink 320 are mounting holes that may be used to mount heatsink 320 to a heatsink carrier plate. Openings 356 may be arranged to accommodate screws such as shoulder screws, e.g., openings 356 may be threaded. The number of openings 356 in heatsink 320 may vary.

Heatsink 320 may be formed from any suitable material that absorbs and dissipates heat. Materials from which heatsink 320 is formed may include, but are not limited to, metallic materials such as aluminum, zinc, and brass. It should be appreciated that heatsink 320 may be of substantially any shape or size, and may include fins (not shown) of different styles.

Figure 4:
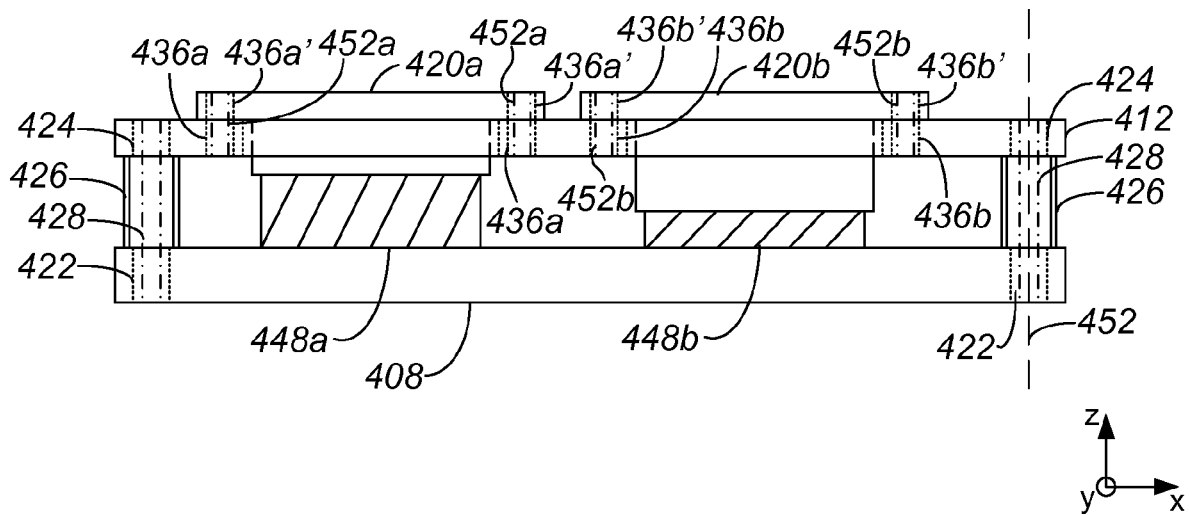
FIG. 4 is a diagrammatic representation of an assembly that includes components of different heights that are in contact with heatsinks supported on a heatsink carrier plate in accordance with an embodiment of the present invention.

A single heatsink carrier plate may support heatsinks that are used to provide cooling to components of different heights. That is, a heatsink carrier plate may be arranged such that components of different heights that underlie the heatsink carrier plate may be cooled. FIG. 4 is a diagrammatic side-view cross-sectional representation of an assembly that includes a board with components of different heights that are in contact with heatsinks supported on a heatsink carrier plate in accordance with an embodiment of the present invention. A board 408 has components 448a, 448 mounted thereon.

Mounting holes 422 defined in board 408 are arranged to facilitate the attachment of board 408 to another structure (not shown), e.g., a tray or a motherboard.

A heatsink carrier plate 412, which includes mounting holes 424, is aligned with board 408 such that heatsinks 420a, 420b are positioned above components 448a, 448b, respectively. A mounting hole 422 is aligned with a mounting hole 424 such that a shared axis 452 is defined substantially therethrough, i.e., mounting holes 422 in board 408 are aligned with mounting holes 424 in heatsink carrier plate 412. Standoffs 426 are arranged to maintain a separation between heatsink carrier plate 412 and board 408, e.g., a separation of between approximately 0.15 inches and approximately 0.2 inches. Fastener arrangements 428 are inserted through mounting holes 424, standoffs 426, and mounting holes 422 to secure heatsink carrier plate 412 to board 408. It should be appreciated that fastener arrangements 428 may further secure heatsink carrier plate 412 and board 408 to an underlying structure (not shown). In one embodiment, fastener arrangements 428 may each include a single screw, although each fastener arrangement 428 may instead include multiple screws.

Some portions of heatsinks 420a, 420b are supported on heatsink carrier plate 412 while other portions of heatsinks 420a, 420b extend through or beyond openings in heatsink carrier plate 412 to contact components 448a, 448b, respectively. Mounting holes 436a' of heatsink 420a may be aligned with mounting holes 436a of heatsink carrier plate 412 such that fastener arrangements 452a secure heatsink 420a to heatsink carrier plate 412. Similarly, mounting holes 436b' of heatsink 420b may be aligned with mounting holes 436b of heatsink carrier plate 412 such that fastener arrangements 452b secure heatsink 420b to heatsink carrier plate 412

Heatsink 420a is sized to contact component 448a, while heatsink 420b is sized to contact component 448b. As component 448a is taller than component 448b, heatsink 420a is not arranged to extend or jut out as far below heatsink carrier plate 412 as heatsink 420b. Hence, a single heatsink carrier plate 412 may be used to support heatsinks 420a, 420b that provide absorb heat from components of different heights.

Figure 5:
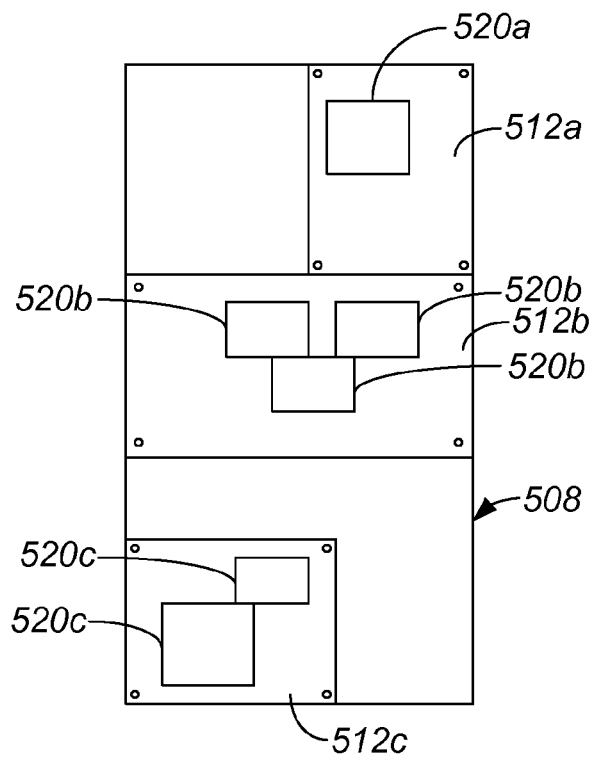
FIG. 5 is a diagrammatic representation of a circuit board on which multiple heatsink carrier plates are mounted in accordance with an embodiment of the present invention.

Any number of heatsink carrier plates may overlay a board that includes components to be cooled. That is, in lieu of using a single heatsink carrier plate to support substantially all heatsinks that are used to provide heat absorption capabilities to a board, a plurality of heatsink carrier plates may be used. By way of example, the location of components in need of heatsinks may be such that utilizing different heatsink carrier plates is more efficient than utilizing a single heatsink carrier plate. FIG. 5 is a diagrammatic top-view representation of a circuit board on which multiple heatsink carrier plates are mounted in accordance with an embodiment of the present invention. A board 508 which includes components to be cooled may be overlaid with a plurality of heatsink carrier plates 512a-c. Each heatsink carrier plate 512a-c may support any number of heatsinks 520a-c.

Figure 6:
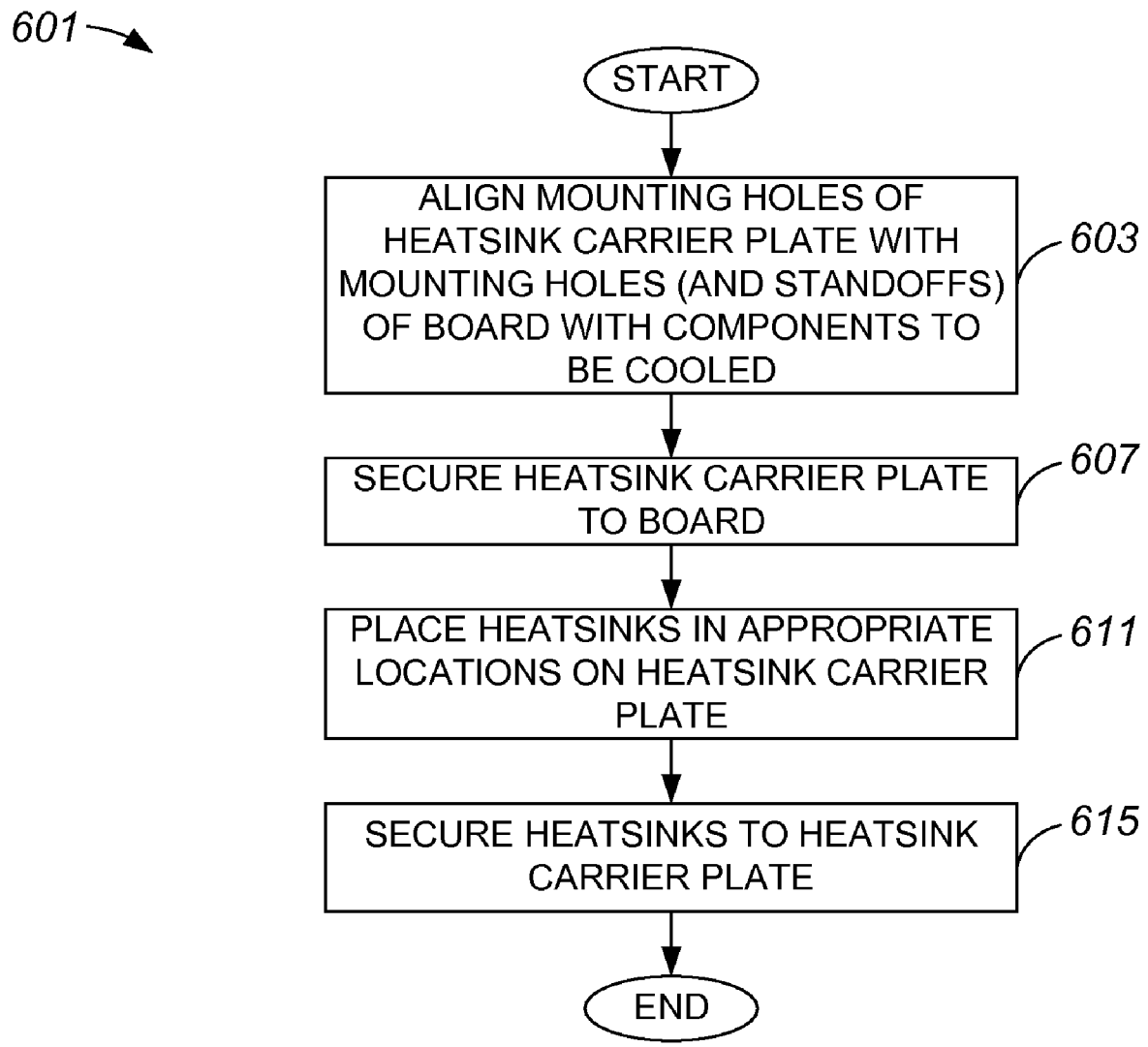
FIG. 6 is a process flow diagram which illustrates one method of assembling an assembly that includes a heatsink carrier plate in accordance with an embodiment of the present invention.

FIG. 6 is a process flow diagram which illustrates one method of assembling an assembly that includes a heatsink carrier plate in accordance with an embodiment of the present invention. A process 601 begins at step 603 in which a mounting holes of a heatsink carrier plate are aligned with mounting holes of a board, e.g., a circuit board, on which components that are to be cooled are positioned. Aligning the mounting holes of the heatsink carrier plate and the mounting holes of the board may include positioning a mounting hole of the heatsink carrier plate such that a center point of the mounting hole is substantially aligned with a center point of a mounting hole of the board, e.g., such that an axis may pass through the center points. As standoffs may be used to provide a separation between the board and the heatsink carrier plate, aligning the mounting holes of the heatsink carrier plate with the mounting holes of the board may also include aligning the standoffs with the mounting holes of both the heatsink carrier plate and the board. It should be appreciated that aligning mounting holes of the heatsink carrier with mounting holds of the board generally also enables openings in the heatsink carrier plate to be positioned substantially over the components of the board that are to be cooled.

After the alignment of mounting holes is achieved, the heatsink carrier plate is secured to the board in step 607. Securing the heatsink carrier plate to the board may include attaching the heatsink carrier plate to the board using a fastener such as a screw or a screw and washer combination. In one embodiment, when the board is a daughter board that is positioned over a motherboard, securing the heatsink carrier plate to the board may include effectively securing the heatsink carrier plate to the motherboard through the daughterboard.

Once the heatsink carrier plate is secured to the board, any heatsinks that are to be secured to the heatsink carrier plate are positioned on the heatsink carrier plate in step 611. That is, heatsinks are placed on the heatsink carrier plate such that the heatsinks are supported on the heatsink carrier plate while bottom surfaces of the heatsinks may come into contact with the components that are to be cooled. In step 611, the heatsinks are secured to the heatsink carrier plate, e.g., using shoulder screws and o-rings. O-rings may act as complaint members that provide a substantially repeatable and relatively limited force on the heatsink, as well as the component that is to be cooled by the heatsink. The pressure applied on the component by the heatsink may be adjusted using the shoulder screws. The process of assembling an assembly that includes a heatsink carrier plate is completed after the heatsinks are secured on the heatsink carrier plate.

Although only a few embodiments of the present invention have been described, it should be understood that the present invention may be embodied in many other specific forms without departing from the spirit or the scope of the present invention. By way of example, separate heatsinks have been shown as being assembled to a heatsink carrier plate for the purposes of cooling different components. In other words, each component that is to be cooled has generally been shown as having a substantially dedicated heatsink. The use of substantially dedicated heatsinks enables individual heatsinks to be removed form a heatsink carrier plate as needed, e.g., for debugging purposes. Hence, the heatsink carrier plate need not be decoupled from a board in order for a single heatsink to be removed from having contact with a component on the board. However, more than one component may be arranged to be cooled by a single heatsink mounted on a heatsink carrier plate.

The characteristics of a heatsink carrier plate may vary widely. The size and the thickness of a heatsink carrier plate may vary depending upon the requirements of a particular system. In one embodiment, a heatsink carrier plate may have a thickness of approximately one-sixteenth of an inch. Further, the material from which a heatsink carrier plate is formed may also vary. Suitable materials include, but are not limited to, cold-rolled steel, stainless steel, and aluminum. Aluminum may be selected as a material from which a heatsink carrier plate is formed if the heatsink carrier plate is to act as a heat spreader, e.g., for thermal conductivity of up to approximately 200 Watt per meter per Kelvin (W/m-K).

Stainless steel may be selected if a lighter heatsink carrier plate is desired, and if thermal conductivity is up to approximately 15 W/m-K.

A heatsink carrier plate may be used as a heat spreader, e.g., a heat spreader for memories in areas where memories are to be cooled. Configuring a heatsink carrier plate for use as a heat spreader may involve extending protrusions or embosses on the heatsink carrier plate.

A heatsink carrier plate may include openings that allow tall components of a board over which the heatsink carrier plate is mounted to pass therethrough, as discussed above. A heatsink carrier plate may also include openings that are arranged to lighten the heatsink carrier plate. That is, a heatsink carrier plate may include perforated hole patterns that reduce the overall weight of the heatsink carrier plate.

In one embodiment, a heatsink carrier plate may be secured by one structure such that the heatsink carrier plate is positioned over another structure. By way of example, a heatsink carrier plate may be secured to a chassis such that heatsinks carried on the heatsink carrier plate may be used to cool components of a board positioned within the chassis. That is, a heatsink carrier plate may be secured to substantially any structure to provide cooling to a board, and is not limited to being secured to the board itself.

If a heatsink carrier plate is arranged to shield a motherboard, the heatsink carrier plate may include mounting holes that are arranged to coincide with the mounting holes of the motherboard that are intended to facilitate the mounting of the motherboard to a carrier tray that is positioned in an overall chassis. In other words, a heatsink carrier plate is not limited to having mounting holes that coincide with mounting holes of a daughter board supported on a motherboard.

Various methods may be used to secure a heatsink to a heatsink carrier plate. Although a fastener arrangement that includes a shoulder screw and an o-ring has been described as being suitable for securing a heatsink to a heatsink carrier plate, other fasteners may be used without departing from the spirit or the scope of the present invention. By way of example, adhesives may be used to attach heatsinks to a carrier plate. Alternatively, mechanical clamping mechanisms including, but not limited to, wire retainers such as Omega clips, may be used to mount heatsinks to a carrier plate.

While the present invention has been described as including a heatsink carrier plate that supports heatsinks over a component to be cooled, it should be appreciated that a heatsink carrier plate may instead support heatsinks under or next to a component to be cooled. That is, a heatsink carrier plate may support heatsinks in orientations that enables the heatsinks to contact components to be cooled. Alternatively, a heatsink that is positioned over a component to be cooled may be considered to be a heatsink that is held in a position that is in proximity to a component to be cooled.

A standoff used to separate a heatsink carrier tray from a circuit board may be threaded on the inside such that a screw may be used to secure the heatsink carrier tray to the standoff. In one embodiment, a standoff may be secured to the circuit board using one screw and secured to the heatsink carrier tray using another screw. Alternatively, a single screw may be used to secure both the circuit board and the heatsink carrier tray to a standoff.

The steps associated with the methods of the present invention may vary widely. Steps may be added, removed, altered, combined, and reordered without departing from the spirit of the scope of the present invention. For example, if a heatsink is to be used with a thermal interface material or a relatively high conductivity gap filler pad, the material or the pad may be positioned between a heatsink and a component to be cooled prior to placing the heatsink in an appropriate location on a heatsink carrier plate. Therefore, the present examples are to be considered as illustrative and not restrictive, and the invention is not to be limited to the details given herein, but may be modified within the scope of the appended claims.

What is claimed is:

1. A carrier plate assembly, the carrier plate assembly being arranged to be secured over a structure, the structure being arranged to define at least a first structure hole, the structure including at least a first component, the carrier plate assembly comprising:

a carrier plate, the carrier plate having a first plate mounting hole and, a first opening, and a first component opening defined therein, the first plate mounting hole being arranged to be aligned with the first structure hole such that a first axis is defined through the first plate mounting hole and the first structure hole, the first opening being arranged to be positioned over the first component, the first component opening being arranged to accommodate a feature of the structure, wherein a first heatsink mounting hole is defined in the carrier plate; and a first heatsink, the first heatsink being arranged to be positioned such that a first portion of the first heatsink protrudes through the first opening and a second portion of the first heatsink is supported on the carrier plate, wherein the second portion of the first heatsink overlaps the first heatsink mounting hole, the first heatsink mounting hole being arranged to enable the first heatsink to be mounted on the carrier plate.

2. The carrier plate assembly of claim 1 wherein the first portion of the first heatsink is arranged to contact the first component.

3. The carrier plate assembly of claim 1 wherein the first heatsink includes a first heatsink opening, the carrier plate assembly further including:

a first fastener arranged to be interfaced with the first heatsink mounting hole and the first heatsink opening to secure the first heatsink to the carrier plate.

4. The carrier plate assembly of claim 1 wherein the carrier plate includes a second opening defined therein, the carrier plate assembly further including:

a second heatsink, the second heatsink being arranged to be positioned such that a first portion of the second heatsink protrudes through the second opening and a second portion of the second heatsink is supported on the carrier plate.

5. The carrier plate assembly of claim 1 further including:

a standoff, the standoff being aligned with the first plate mounting hole and the first structure hole such that the first axis passes therethrough, wherein the standoff maintains a spacing between the carrier plate and the structure.

6. The carrier plate assembly of claim 1 wherein the carrier plate is formed from one selected from the group including cold-rolled steel, stainless steel, and aluminum.

7. An assembly comprising:

a carrier plate, the carrier plate being arranged to be positioned over a structure, the carrier plate having at least a first opening and a first component opening defined therethrough, wherein the carrier plate further has at least a first mounting hole defined therethrough, the first component opening being arranged to accommodate a feature of the structure;

a first heatsink, the first heatsink being arranged such that a first portion of the first heatsink is supported on the carrier plate and a second portion of the first heatsink is positioned at least partially in the first opening, wherein the first heatsink has a first heatsink hole defined therethrough; and a screw arrangement, the screw arrangement being capable of interfacing with the first mounting hole and the first heatsink hole to attach the first heatsink to the carrier plate.

8. The assembly of claim 7 wherein the carrier plate has a second opening defined therethrough, and the assembly further includes:

a second heatsink, the second heatsink being arranged such that a first portion of the second heatsink is supported on the carrier plate and a second portion of the second heatsink is positioned at least partially in the second opening.

9. The assembly of claim 7 wherein the carrier plate has a first hole defined therethrough, the first hole being arranged to enable the assembly to be secured to an external structure.

10. An assembly comprising:

a first structure;

a first circuit board, the first circuit board including a first component and a second component, the first circuit board having a first circuit board opening defined therein;

a first fastener arrangement capable of securing the first circuit board to the first structure through the first circuit board opening;

a heatsink carrier tray, the heatsink carrier tray having a first heatsink carrier tray opening defined therein, the heatsink carrier tray further having a second heatsink carrier tray opening and a third heatsink carrier tray opening defined therein, wherein the first heatsink carrier tray opening is aligned with the first circuit board opening and the first fastener arrangement is further capable of securing the heatsink carrier tray to the first structure, and wherein the third heatsink carrier tray opening is aligned with the second component; and a heatsink, the heatsink being arranged to be supported on the heatsink carrier tray such that the heatsink is at least partially located within the second heatsink carrier tray opening and in contact with the first component through the second heatsink carrier tray opening, wherein the heatsink is supported on the heatsink carrier tray using at least one screw arrangement.

11. An assembly comprising:

a first structure;

a first circuit board, the first circuit board including a first component, the first circuit board having a first circuit board opening defined therein, wherein the first structure is a second printed circuit board;

a first fastener arrangement capable of securing the first circuit board to the first structure through the first circuit board opening;

a heatsink carrier tray, the heatsink carrier tray having a first heatsink carrier tray opening defined therein, the heatsink carrier tray further having a second heatsink carrier tray opening defined therein, wherein the first heatsink carrier tray opening is aligned with the first circuit board opening and the first fastener arrangement is further capable of securing the heatsink carrier tray to the first structure; and a heatsink, the heatsink being arranged to be supported on the heatsink carrier tray such that the heatsink is in contact with the first component through the second heatsink carrier tray opening.

12. An assembly comprising:

a first structure, wherein the first structure is a board carrier tray;

a first circuit board, the first circuit board including a first component, the first circuit board having a first circuit board opening defined therein;

a first fastener arrangement capable of securing the first circuit board to the first structure through the first circuit board opening;

a heatsink carrier tray, the heatsink carrier tray having a first heatsink carrier tray opening defined therein, the heatsink carrier tray further having a second heatsink carrier tray opening defined therein, wherein the first heatsink carrier tray opening is aligned with the first circuit board opening and the first fastener arrangement is further capable of securing the heatsink carrier tray to the first structure; and a heatsink, the heatsink being arranged to be supported on the heatsink carrier tray such that the heatsink is in contact with the first component through the second heatsink carrier tray opening.

13. An assembly comprising:

a first structure;

a first circuit board, the first circuit board including a first component, the first circuit board having a first circuit board opening defined therein;

a first fastener arrangement capable of securing the first circuit board to the first structure through the first circuit board opening, wherein the first fastener arrangement includes a first fastener and a first standoff, the first fastener being arranged to secure the first standoff and the first circuit board to the first structure;

a heatsink carrier tray, the heatsink carrier tray having a first heatsink carrier tray opening defined therein, the heatsink carrier tray further having a second heatsink carrier tray opening defined therein, wherein the first heatsink carrier tray opening is aligned with the first circuit board opening and the first fastener arrangement is further capable of securing the heatsink carrier tray to the first structure; and a heatsink, the heatsink being arranged to be supported on the heatsink carrier tray such that the heatsink is in contact with the first component through the second heatsink carrier tray opening.

14. The assembly of claim 13 wherein the first fastener arrangement further includes a second standoff, the second standoff being arranged to separate the heatsink carrier tray from the first circuit board such that the heatsink carrier tray does not contact the component.

* * * * *